United States Patent [19]
Inoue et al.

[11] Patent Number: 6,099,241
[45] Date of Patent: Aug. 8, 2000

[54] SUBSTRATE TRANSFER METHOD AND SUBSTRATE TRANSFER CASSETTE

[75] Inventors: Isamu Inoue, Neyagawa; Koichi Kotera, Osaka; Osamu Matsunaga, Kyoto, all of Japan; Kiyohiko Kitagawa, Singapore, Singapore; Takayuki Taguchi, Kadoma, Japan

[73] Assignee: Matsushita Electric Industrial Co., Ltd., Japan

[21] Appl. No.: 09/025,812

[22] Filed: Feb. 19, 1998

[30] Foreign Application Priority Data

Feb. 24, 1997 [JP] Japan ................................. 9-038707

[51] Int. Cl.⁷ ................................. B65G 67/00; H01J 9/48
[52] U.S. Cl. ...................... 414/809; 414/391; 414/392; 414/396; 414/401; 414/940
[58] Field of Search ........................ 414/391, 392, 414/401, 809, 940, 396, 584, 222.01, 222.02; 118/500

[56] References Cited

U.S. PATENT DOCUMENTS

| | | | |
|---|---|---|---|
| 821,567 | 5/1906 | Wines | 414/911 |
| 982,977 | 1/1911 | Morgan | 414/391 |
| 1,467,540 | 9/1923 | Ford | 414/391 |
| 3,938,671 | 2/1976 | Lewey et al. | 414/911 |
| 4,131,206 | 12/1978 | Kawada et al. | 414/684 |
| 4,787,141 | 11/1988 | Miyaxaki et al. | 901/1 |
| 5,064,337 | 11/1991 | Asakawa et al. | 414/940 X |
| 5,562,385 | 10/1996 | Tacchi et al. | 414/391 |
| 5,655,869 | 8/1997 | Scheler et al. | 414/222.01 |
| 5,685,684 | 11/1997 | Kato et al. | 414/940 |

FOREIGN PATENT DOCUMENTS 6-244266  9/1994  Japan ................................. 414/940

*Primary Examiner*—Robert P. Olszewski
*Assistant Examiner*—Thuy V. Tran
*Attorney, Agent, or Firm*—Parkhurst & Wendel, L.L.P.

[57] ABSTRACT

To cope with recent LCD or PDP of larger size, an efficient transfer technology is demanded in manufacturing a larger substrate. It calls for a transfer method for such larger substrate with a less required space, and a substrate transfer cassette enabling such method. A technology is disclosed, which comprises a substrate transfer cassette (50) containing a plurality of substrates, a dolly (55) for loading the substrate transfer cassette (50), and a plurality of cassette holders (70) having a rotating arm (71) which can rotate in the vertical direction, wherein a substrate cassette (50) is transferred from a position near another cassette holder to a position near a destination cassette holder with the dolly (55), raised by the rotating arm (71) on the destination cassette holder (70) from the lower section to the upper section of the dolly (55), and moved from the dolly (55) to the cassette holder (70).

6 Claims, 11 Drawing Sheets

HD SIDE

PRIOR ART

PRIOR ART 6,099,241

SUBSTRATE TRANSFER METHOD AND SUBSTRATE TRANSFER CASSETTE

FIELD OF THE INVENTION

The present invention relates to a substrate transfer method and substrate transfer cassette in manufacturing a liquid crystal display (LCD), a plasma display panel (PDP) or the like.

BACKGROUND OF THE INVENTION

Recently, an LCD or PDP is demanded from its application for a larger size as a display which is easy to view and more expressive, and from its manufacturing cost for higher yield from one substrate. To meet such demands, the substrate size is being made more and more larger for the panel. In particular, the PDP can be produced of a larger size than the LCD, a larger substrate is particularly demanded, which requires an efficient substrate transfer method in manufacturing a large substrate.

Now, an example of a conventional substrate transfer method is described with reference to the drawings.

FIG. 19 shows a substrate transfer method using a conventional substrate transfer cassette (hereinafter abbreviated to a "cassette") 10, a dolly 20, and a cassette holder 30 schematically shown in a side view. In the figure, the cassette 10 contains a plurality of substrates 1. Omitted in the figure is a tray for holding the substrates 1 with a pitch P. In addition, FIG. 19 shows a state where the dolly 20 loading the cassettes 10 has been automatically or manually moved from a position near a cassette holder (not shown) in the previous process to a position near the cassette holder 30 in the next process. Then, as shown in FIG. 20, the cassette 10 is moved over the holder 30 by extending arms 21a and 21b mounted on the dolly 20 in a direction of arrow A, and then placed on a predetermined position on the cassette holder 30 by lowering the arms 21a and 21b in a direction of arrow B. Reference numeral 31 denotes a recess for preventing interference between the arms 21a, 21b and the cassette holder 30. Furthermore, the arms 21a and 21b are retracted in a direction opposite to the arrow A and housed in the dolly 20 to attain the state of FIG. 21. Subsequently, the substrates 1 are aligned at the center of the cassette 10 in a direction orthogonal to a substrate entry/takeout direction (direction of arrow C) by a substrate aligning bar 32 mounted on the cassette holder 30. This is done to prevent the substrate 1 from striking against a side plate 11 of the cassette 10 shown in FIG. 22 when the substrate 1 is extracted from the cassette 10 in the direction of arrow A from the side opposite to the dolly 20 (HD side in FIG. 20) with respect to the cassette holder 30 as shown in FIG. 20 by a conventional robot (not shown), or to allow the robot to accurately place the substrate 1 extracted from the cassette 10 on a predetermined position on a substrate processing machine (not shown). The operation for aligning the substrates 1 is described with reference to FIG. 22 which shows a front view of FIG. 21. In FIG. 22, when the substrate aligning bar 32 is pushed in a direction of arrow D by an air cylinder (not shown) or the like, the substrate aligning bar 32 moves forward to a position 32a indicated by a chain line as shown in FIG. 23, and pushes both sides of the substrates 1 which have been unaligned until then as shown in FIG. 22, thereby positioning all the substrates 1 at the center of the cassette 10 in a direction (directions of arrows D and E in FIG. 23) orthogonal to the substrate entry/takeout direction (direction of arrow C in FIG. 21). Then, the substrate aligning bar 32 is driven in the direction of arrow E by an air cylinder or the like, and returned to its original position to complete the aligning operation.

However, with the arrangement described above, if length L of the substrate 1 in the cassette 10 shown in FIG. 19 becomes longer, the entire length $S_1$ of the dolly 20 and the cassette holder 30 becomes very long. Since the cassette holder 30 is positioned near the substrate entry/takeout port of a substrate processing machine, if the number of substrate processing machines increases, the area occupied by the dolly 20 and the cassette holder 30 becomes too large, so that a large clean room is necessary. A large clean room increases not only its construction cost, but also the operation cost for maintaining cleanness, leading to high production cost.

In view of the above problem, the present invention is intended to provide a substrate transfer method and a substrate transfer cassette, which enable it to reduce the entire length of the dolly and the cassette holder.

DISCLOSURE OF THE INVENTION

To solve the above problem, a substrate transfer method according to a first aspect of the present invention comprises the steps of: moving a dolly to a location near a cassette holder, the dolly loading substrate transfer cassettes containing substrates; raising the substrate transfer cassette with a rotating arm which is mounted on the cassette holder; and transferring the substrate transfer cassette on the dolly to the cassette holder. With this method, the cassette holder is sufficient to have only a length for housing the rotating arm and its driving means, whereby a total length of the dolly and the cassette holder can be dramatically reduced as compared to any conventional construction.

A substrate transfer method according to a second aspect of the present invention comprises the steps of: moving a dolly to a location near a cassette holder, the dolly loading a substrate transfer cassette containing substrates; raising the substrate transfer cassette with a rotating arm which is mounted on the cassette holder; transferring the substrate transfer cassette on the dolly to the cassette holder; and moving the substrate transfer cassette on the cassette holder in a direction opposite to the dolly by a predetermined distance. With this method, the cassette can be moved to a location opposite to the dolly, and placed on the cassette holder, whereby a distance can be shortened for extracting a substrate from the cassette from the side of the cassette holder opposite to the dolly. Therefore, it is possible to shorten a stroke of a robot for extracting a substrate from a cassette, whereby the robot can be inexpensively constructed.

A substrate transfer method according to a third aspect of the present invention comprising the steps of: moving a dolly to a cassette holder, the dolly loading a substrate transfer cassette containing substrates; and positioning the dolly by pushing it between at least a pair of rollers mounted on the cassette holder in such a manner that the rollers hold both outer sides of the dolly therebetween. With this method, when an operator manually positions the dolly, he/she can easily perform the positioning by pushing in the dolly in such a manner that its outer sides of the dolly contact the guide rollers while observing the outer sides, whereby good operability can be obtained.

A substrate transfer method according to a fourth aspect of the present invention is the method of the first or second aspect described above, wherein the substrate transfer cassette and the dolly, and the substrate transfer cassette and the rotating arm of the cassette holder, respectively, have fitting sections between each other, and a plurality of the substrate transfer cassettes with different outer dimensions have the fitting sections of a common size. With this method, even if the cassettes are of different sizes, there is no need to change the dimensions of the dolly or the cassette holder, whereby substrates of different sizes can be efficiently fed to the process.

A substrate transfer cassette according to a fifth aspect of the present invention comprises: a cassette body for containing substrates; an opening/closing member for opening or closing an entry/takeout port for the substrates in the cassette body; a substrate rear end positioning member close to each end corner of the rear end of the substrate, which is at the opposite side to the entry/takeout port side of the substrate, and for positioning the rear end of the substrate at the center of the cassette body in a direction orthogonal to the entry/takeout direction of the substrate; and a substrate front end positioning member mounted on the opening/closing member, close to each end corner of the front end of the substrate, which is at the entry/takeout side of the substrate, and for positioning the front end of the substrate at the center of the cassette body in a direction orthogonal to the entry/takeout direction of the substrate. With this arrangement, the substrate is positioned at the center of cassette by opening or closing the opening/closing member, so that it is not necessary to align the substrates on the cassette holder, thereby simplifying the structure of the cassette holder for performing the transfer according to the first aspect.

A substrate transfer cassette according to a sixth aspect of the present invention comprises: a cassette body for containing substrates; a cover for covering five sides of the cassette body other than the entry/takeout port for the substrate; a front cover for opening or closing the entry/takeout port; a substrate rear end positioning member close to each end corner of the rear end of the substrate, which is at the opposite side to the entry/takeout side of the substrate, and for positioning the rear end of the substrate at the center of the cassette body in a direction orthogonal to the entry/takeout direction of the substrate; and a substrate front end positioning member mounted on the front cover, close to each end corner of the front end of the substrate, which is at the entry/takeout side of the substrate, and for positioning the front end of the substrate at the center of the cassette body in a direction orthogonal to the entry/takeout direction of the substrate. With this arrangement, it is possible to attain an advantage similar to that of the fifth aspect, and, as six sides of the cassette are closed, even if the cassette is transferred through environment with poor cleanness, the substrates therein are not contaminated, so that a transfer path may have a lower cleanness. Therefore, not only the cost can be reduced for constructing a clean room, but also the operation cost can be reduced for maintaining cleanness.

A substrate transfer cassette according to a seventh aspect of the present invention comprises a cassette body for containing substrates, a cover for covering sides of the cassette body other than the entry/takeout port for the substrate, a front cover being capable of opening or closing the entry/takeout port, and wheels mounted on the bottom of the cassette body. With this arrangement, even if the cassette containing substrates has heavier weight due to a larger substrate size, it can be moved easily and without contamination of the substrates by, for example, rolling on the floor without using the dolly, so that it can highly accommodate an emergency situation.

A substrate transfer cassette according to an eighth aspect of the present invention comprises a cassette body for containing substrates, and a plurality of substrate support members abutting against the edges of the substrate for supporting the substrate, wherein the substrate support member comprises a plurality of shafts vertically mounted, and a plurality of rotary support members rotatably mounted on the shafts by restricting vertical positions with restricting members. With this arrangement, when a substrate is manually inserted in or extracted from the cassette, even if the substrate collides against the support member supporting the substrate, the support member rotates, so that impact of collision is relieved and generation of dust can be minimized.

A substrate transfer cassette according to a ninth aspect of the present invention comprises a cassette body for containing substrates, and a plurality of substrate support members abutting against the edges of the substrate for supporting the substrate, wherein the substrate support member comprises a plurality of shafts vertically mounted and rotary support members rotatably mounted on the shafts by restricting vertical positions with restricting members, and a dust receiving collar being formed on the rotary support member for receiving dust generated from rotating contact between the rotary support member and the restricting member. With this arrangement, dust generated from a rotating contact area can be received before it spreads into a space in the cassette, so that contamination of the substrate can be prevented.

A substrate transfer cassette according to a tenth aspect of the present invention comprises a cassette body for containing substrates, and a plurality of substrate support members abutting against the edges of the substrate for supporting the substrate, wherein the substrate support member comprises a plurality of shafts vertically provided, and a plurality of rotary support member rotatably mounted on the shafts and vertically restricted by restricting members, the rotary support member comprising a cylindrical section and a collar supporting the substrate, an angle between the upper side surface of the cylindrical section and the bottom of the cylindrical section being larger than that between the lower side surface of the cylindrical section and the bottom of the cylindrical section, and a large diameter lower end at the lower section of the cylindrical section being close to the edge of the substrate. With this arrangement, the large diameter lower end on the lower outer surface of the cylindrical section of the rotary support member is caused to be close to the edge of the substrate, so that the substrate can be positioned without need to be aligned on the cassette holder as in the substrate transfer cassette of the fifth aspect. Therefore, the cassette holder can have a very simple structure for transferring a substrate.

A substrate transfer cassette according to an eleventh aspect of the present invention is the substrate transfer cassette of the tenth aspect, further comprising: an opening/closing member for opening or closing the entry/takeout port of the cassette body for the substrate; a substrate rear end positioning member close to the rear end of the substrate, which is at the opposite side to the entry/takeout side of the substrate; and a substrate front end positioning member mounted on the opening/closing member, and close to the front end of the substrate, which is at the entry/takeout side of the substrate. With this arrangement, it can attain an advantage similar to that of the sixth aspect.

DESCRIPTION OF THE EMBODIMENTS

Now, embodiments of the present invention will be explained with reference to the drawings.

[Embodiment 1]

Figure 1:
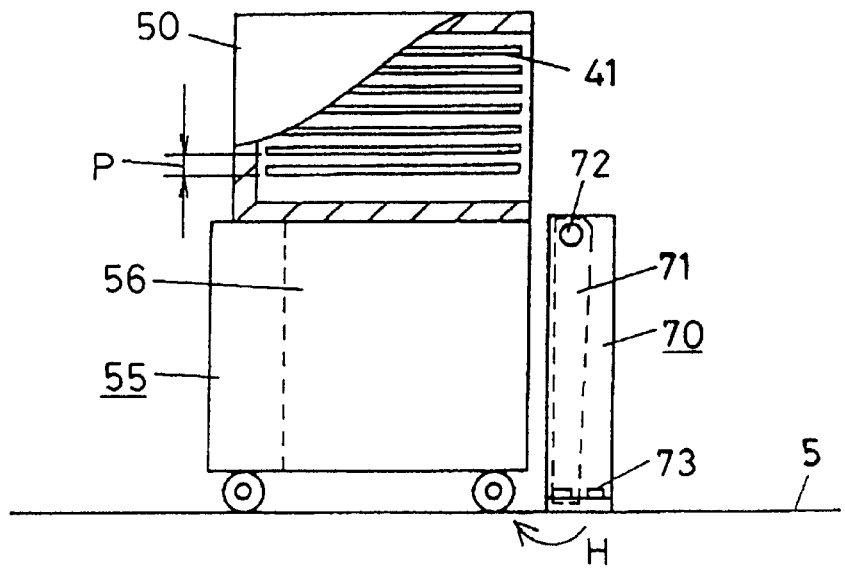
FIG. 1 is a partially cut-out side view for illustrating a substrate transfer method according to embodiment 1 of the present invention.
Figure 2:
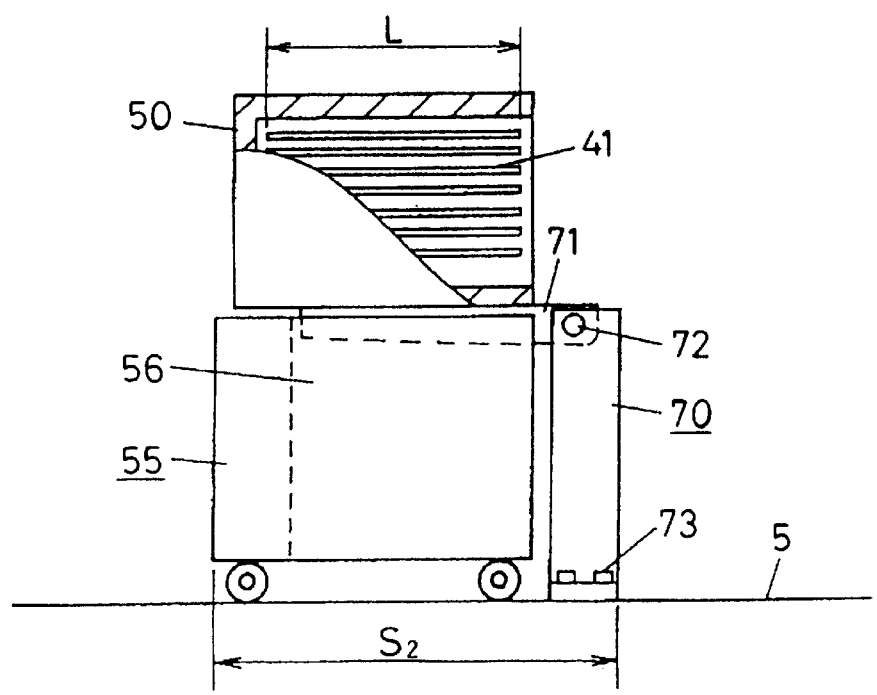
FIG. 2 is a partially cut-out side view for illustrating operation in the embodiment.

FIGS. 1 and 2 illustrate basic operation of a substrate transfer method according to an embodiment of the present invention. In FIG. 1, a cassette 50 contains a plurality of substrates 41. Omitted in the figure is a tray for holding the substrates 41 with a pitch P provided in the cassette 50. FIG. 1 also shows a state where a dolly 55 loading the cassette 50 has been automatically or manually moved from a position near a cassette holder (not shown) in the previous process to a position near the cassette holder 70 in the next process, and the dolly 55 has been positioned. The dolly 55 may have a conventional brake, if desired, which is applied in this state. In addition, a conventional hook may be extended from the cassette holder 70 to hook the dolly 55 so that the dolly 55 is prevented from being separated too much from the cassette holder 70.

Then, the cassette holder 70 rotates a rotating arm 71 in a direction of arrow H around a shaft 72 as shown in FIG. 1 to raise and hold the cassette 50 as shown in FIG. 2.

Reference numeral 56 denotes an escape for avoiding interference between the rotating arm 71 and the dolly 55. Reference numeral 73 denotes an anchor bolt for securing the cassette holder 70 on the floor 5 so that it does not topple.

Figure 3:
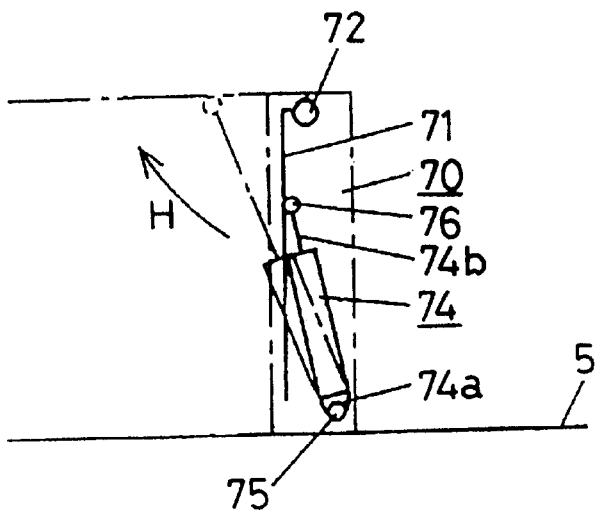
FIG. 3 is a side view for illustrating the operation of essential components of the embodiment.

An example of a method for rotating the rotating arm 71 is described with reference to FIG. 3. A conventional air cylinder 74 is connected to the cassette holder 70 and the rotating arm 71 at the lower end 74a of its body and the end of its rod 74b with pins 75 and 76, respectively. When the rod 74b is extended from the air cylinder 74, the rotating arm 71 rotates in the direction of arrow H as indicated by the chain line. It may be possible to employ a driving method using a motor, a screw and a nut, instead of the air cylinder 74.

Figure 19:
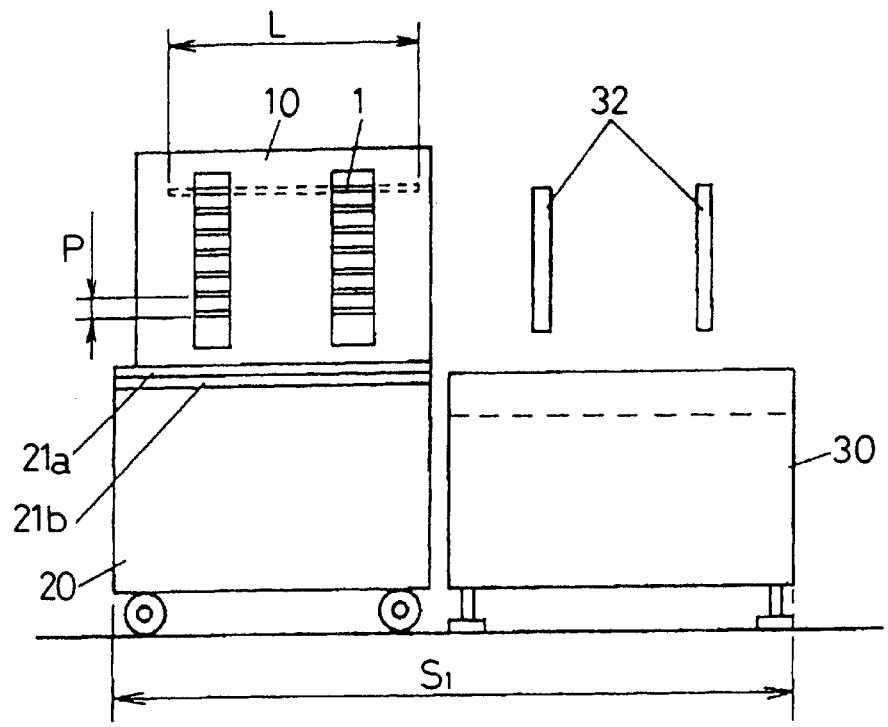
FIG. 19 is a side view for illustrating a conventional substrate transfer method.
Figure 20:
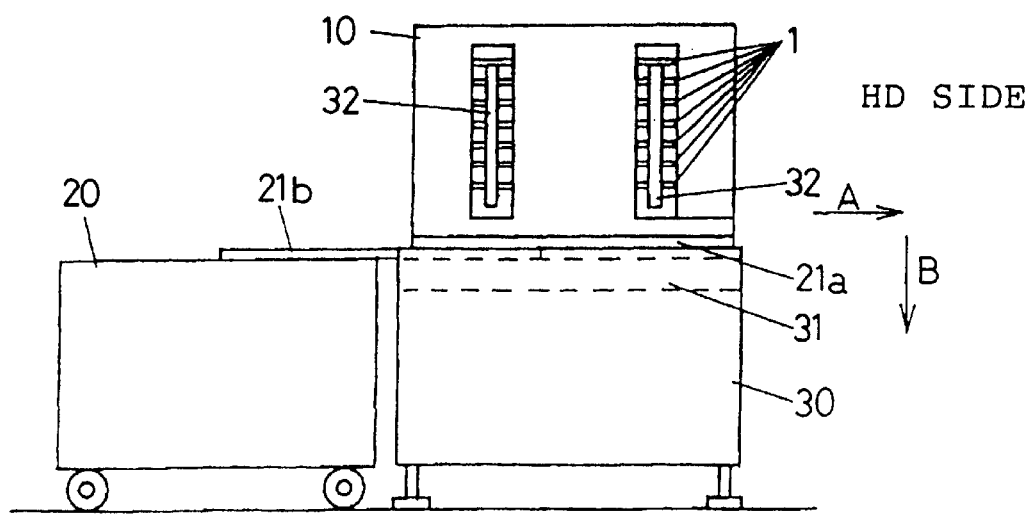
FIG. 20 is a side view for illustrating operation of the method.

With the above arrangement, the entire length S2 of the dolly 55 and the cassette holder 70 shown in FIG. 2 can be significantly reduced from the conventional entire length Si shown in FIG. 19. Since the cassette holder is located at the substrate entry/takeout port of the substrate processing machine, it is possible to significantly reduce the total area occupied by the substrate processing machine, the dolly, and the cassette holder as compared to the conventional arrangement. This configuration allows one to reduce the required area for a clean room, so that there is provided a significant advantage that not only the cost can be reduced for constructing a clean room, but also the operation cost can be reduced for maintaining cleanness.

[Embodiment 2]

Figure 4:
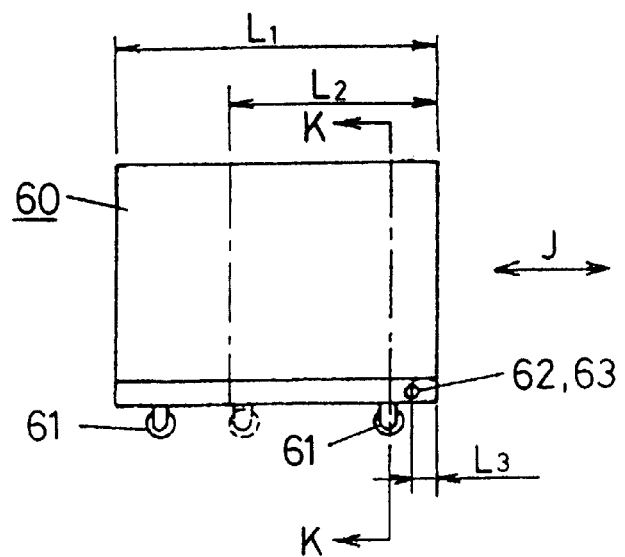
FIG. 4 is a side view for illustrating a substrate transfer method according to embodiment 2 of the present invention.
Figure 5:
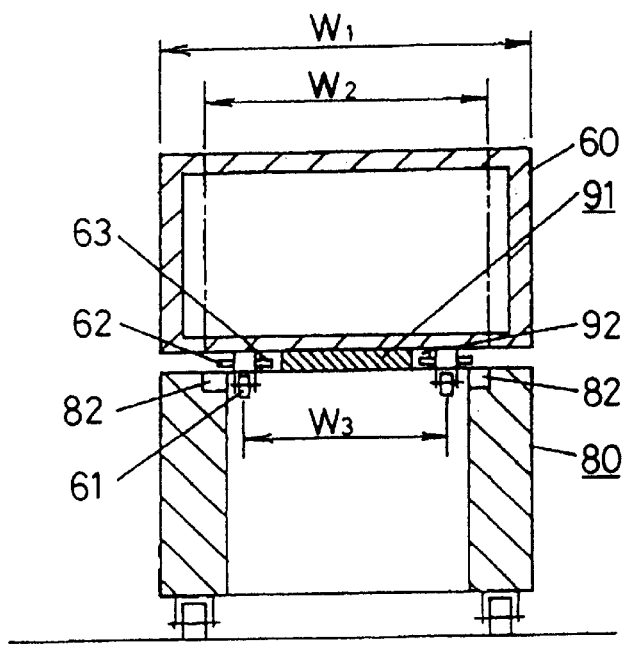
FIG. 5 is a sectional view along line K–K of FIG. 4 including a dolly.
Figure 6:
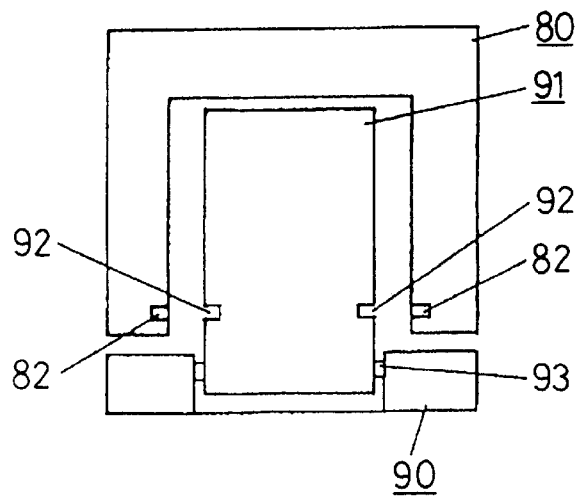
FIG. 6 is a plan view of a dolly and a rotating arm of the embodiment.

Description is given on the substrate transfer method according to another embodiment of the present invention with reference to FIGS. 4 through 6.

FIG. 4 shows a cassette 60 with the substrate omitted. FIG. 5 shows the cassette 60, a dolly 80 applied to the cassette 60, and a rotating arm 91 in a sectional view taken along line K—K in FIG. 4. FIG. 6 is the dolly 80 and the rotating arm 91 viewed from the above in a state where the cassette 60 is removed in FIG. 5. In FIG. 6, a cassette holder 90 is similar to the cassette holder 70 shown in FIG. 1, and has the rotating arm 91. A shaft 93 is similar to the shaft 72 shown in FIG. 1.

In FIGS. 4 and 5, reference numeral 61 denotes wheels mounted on the bottom of the cassette 60, while reference numerals 62 and 63 denote pins. In FIGS. 5 and 6, the dolly 80 has a recess 82 in which the pin 62 can be fitted. The rotating arm 91 has a recess 92 in which the pin 63 can be fitted. As seen from FIG. 5, while the cassette 60 is being carried by the dolly 80, the pin 62 fits in the recess 82, so that the cassette 60 is not displaced from a predetermined position on the dolly 80. In addition, when the rotating arm 91 raises the cassette 60, the pin 63 fits in the recess 92, so that the cassette 60 is not displaced from a predetermined position on the rotating arm 91.

Now, if the size of substrate to be contained in the cassette varies, the size of cassette also varies. As shown in FIGS. 4 and 5, even if the size of the cassette 60 is changed from $L_1$ to $L_2$ in its length, and from $W_1$ to $W_2$ in its width as, for example, the substrate size is reduced, it is not necessary to change the dimensions of the dolly and the cassette holder for a substrate with different size if the dimension $L_3$ from the front end of the cassette 60 to the pins 62 and 63, and a pitch $W_3$ between the centers of pins 62 and 63 are made common, that is, the dimensions of fitting sections between the cassette 60, and the dolly 80 and the rotating arm 91 are made common. Thus, substrates with different size can be efficiently fed to the process.

[Embodiment 3]

Figure 7:
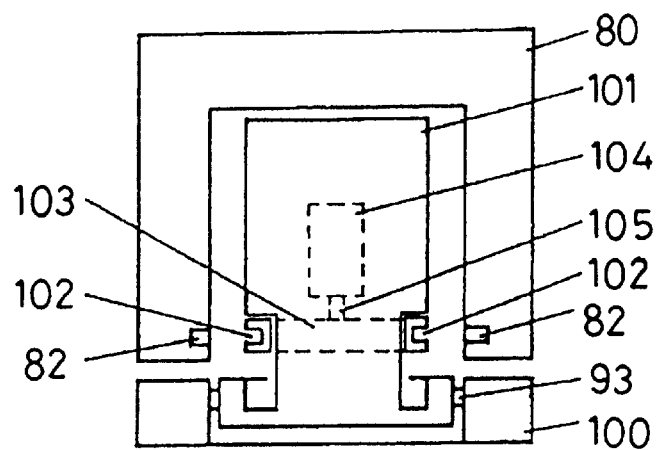
FIG. 7 is a plan view for illustrating a substrate transfer method according to embodiment 3 of the present invention.
Figure 8:
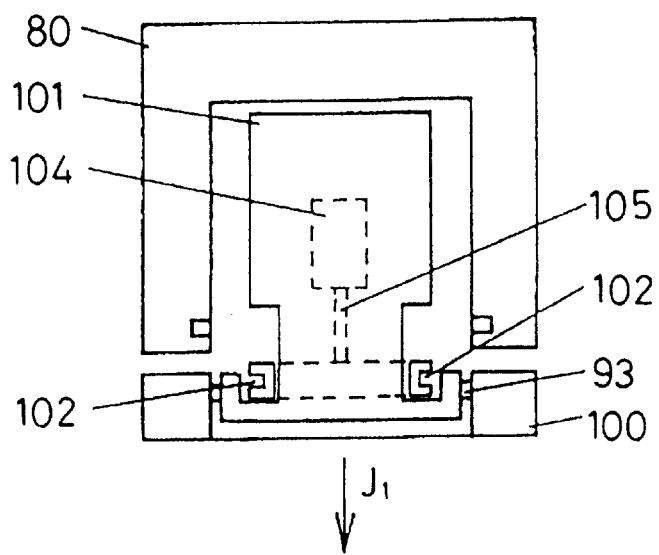
FIG. 8 is a plan view for illustrating operation in the embodiment.
Figure 9:
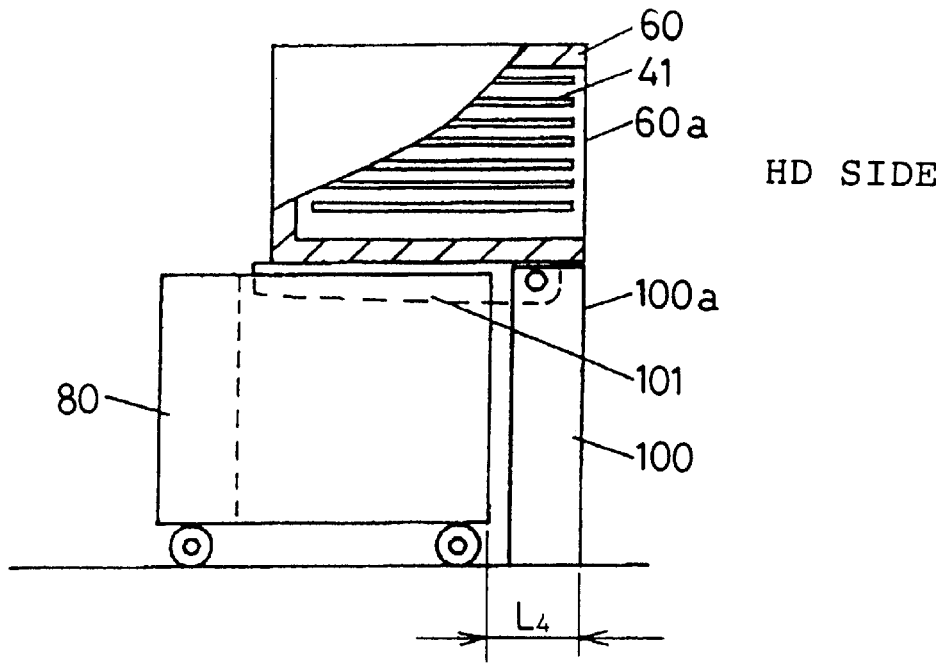
FIG. 9 is a partially cut-out side view for illustrating operation in the embodiment.

Description is given on the substrate transfer method according to another embodiment of the present invention with reference to FIGS. 7 through 9, in which same components as in embodiment 2 are denoted by the same reference numerals.

FIGS. 7 and 8 are the dolly 80, a cassette holder 100 with a rotating arm 101 viewed from the above with the cassette 60 removed as in FIG. 6. In FIG. 7, a cassette feed member 103 has a recess 102 similar to the recess 92 shown in FIG. 6. A conventional air cylinder 104 is secured on the rotating arm 101. A rod 105 of the air cylinder 104 is connected to the cassette feed member 103. With the above arrangement, when the air cylinder 104 is activated and its rod 105 is extended, the cassette feed member 103 is moved toward the direction of arrow $J_1$ as shown in FIG. 8. At the moment, the cassette 60 is fed by the pin 63 fitted into the recess 102 until the front end 60a of the cassette 60 is fed the front end 100a of the cassette holder 100 as shown in FIG. 9. Thus, since the cassette 60 can be raised by the rotating arm 101, transferred onto the cassette holder 100, and fed on the cassette holder 100 in the direction $J_1$ opposite to the dolly 80 by a predetermined distance, and positioned on the cassette holder 100 at a position opposite to the dolly, it is possible to shorten the distance for extracting the substrate from a position opposite to the dolly 80 with respect to the cassette holder 100 or from the HD side as shown in FIG. 9 by a distance $L_4$ than the case of FIG. 2. Therefore, when the substrate 41 is extracted from the cassette 60 by a robot (not shown), an operation stroke of the robot can be reduced, so that the robot can be inexpensively constructed.

Figure 10:
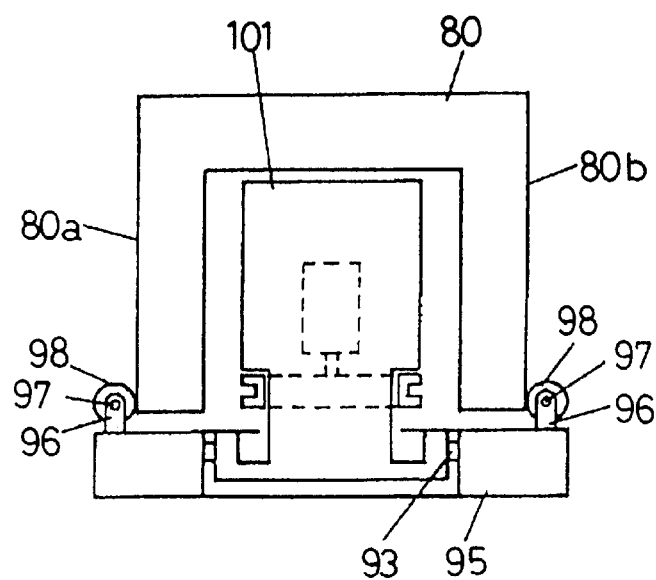
FIG. 10 is a plan view showing an example of another substrate transfer method in the embodiment.

Now, description is given on an example of a method for positioning the dolly 80 with respect to the lateral direction of the cassette holder 100 with reference to FIG. 10.

This method may be applied to the cases of embodiments 1 and 2. A cassette holder 95 is similar to the cassette holder 100, and has a set of two guide rollers 98 each of which is rotatably supported on a bracket 96 and a shaft 97, and has an outer periphery made of, for example, rubber. The dolly 80 is automatically or manually moved to a position near a destination cassette holder from a position near another cassette holder, held and guided at its outer sides 80a and 80b between the guide rollers 98, and positioned at a predetermined position of the cassette holder 95. This operation is performed by an operator for watching either one of the outer sides 80a and 80b of the dolly 80 and pushing in the dolly 80 in such a way that the dolly 80 contacts the guide roller 98 on the side he/she watching. Thus, positioning can be easily attained, and good operability can be obtained.

While the cassette 50 or 60 is raised directly by the rotating arm 71, 91, or 101 in the above embodiments 1–3, the wheels 61 may be raised.

[Embodiment 4]

Figure 11:
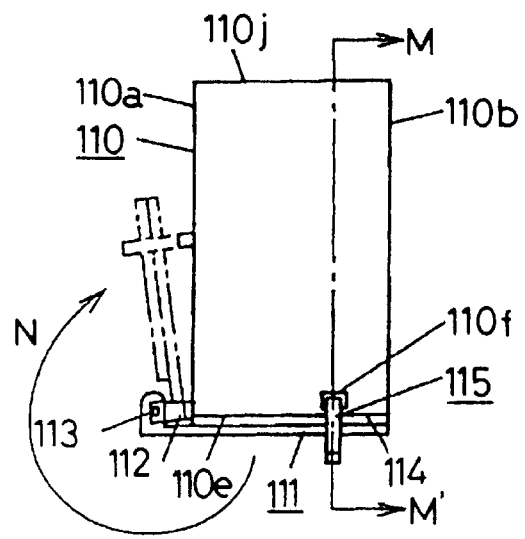
FIG. 11 is a side view of a substrate transfer cassette according embodiment 4 of the present invention.
Figure 12:
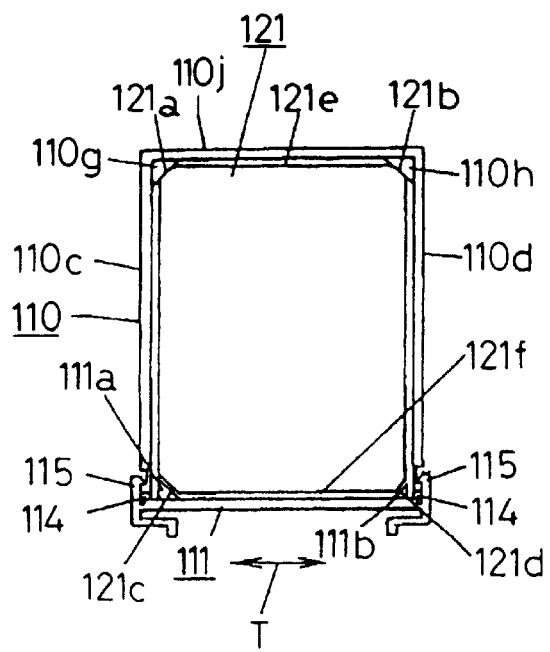
FIG. 12 is a plan view of the embodiment.
Figure 13:
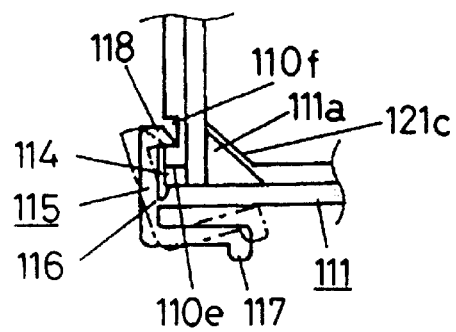
FIG. 13 is an enlarged view of essential components of the embodiment.

Description is given on the substrate transfer cassette according to an embodiment of the present invention with reference to FIGS. 11 through 13.

FIGS. 11 and 12 are a side view and a plan view of a cassette 110, respectively. The cassette 110 are closed by covers for its top surface 110a, bottom surface 110b, side surfaces 110c and 110d, and rear surface 110j, and contains substrates 121 therein as in the cassettes 50 and 60. A front cover 111 is rotatably supported on a pin 113 of a bracket 112 provided on the cassette 110. A packing 114 is mounted on the front cover 111, and closely contacts the front surface 110e of the cassette 110. As shown in FIG. 13, a lock lever 115 is connected to the front cover 111 with a thin hinge 116, and formed with a lock release projection 117 at one end and a lock pawl 118 at the other end. When the lock pawl 118 engages a recess 110f in the side surface of the cassette 110, the front cover 111 tightly closes the front surface 110e of the cassette 110 through the packing 114. When the lock release projection 117 is pressed, the lock lever 115 is rotated around the hinge 116 as indicated by a chain-and-dot line in FIG. 13 to disengage the lock pawl 118 from the recess 110f, so that the front cover 111 can be opened as indicated by arrow N in FIG. 11.

In FIG. 12, a substrate rear end positioning members 110g and 110h are mounted on the cassette 110, close in corner cutouts 121a and 121b formed on the rear corners of the substrate 121, respectively, with a predetermined gap therewith, and positions the rear end 121e of the substrate 121 at the center of the cassette 110 in a direction orthogonal to a substrate entry/takeout direction, or direction T in FIG. 12. Substrate front end positioning members 111a and 111b are mounted on the front cover 111, closes in corner cutouts 121c and 121d formed on the front corners of the substrate 121, respectively, with a predetermined gap, and positions the front end 121f of the substrate 121 at the center in direction T as in the above. These predetermined gaps may be sufficient to be of an amount for maintaining the substrate 121 at its state positioned at the center of the cassette 110 so that a robot (not shown) can place a substrate 121 extracted from the cassette 110 on a predetermined position on a substrate processing machine (now shown). In addition, the substrate front end positioning members 111a and 111b may abut against the corner cutouts 121c and 121d of the substrate 121, respectively. The substrate rear end positioning member 110g and 110h may abut against the corner cutouts 121a and 121b of the substrate 121, respectively. While the corner cutout 121c is made lager than other corner cutouts for identifying the orientation of substrate, it may be of the same size if there is no need for such purpose.

If at least one of the substrate rear end positioning members 110g and 110h, or the substrate front end positioning members 111a and 111b is a resilient member, they may be closely contact the corner cutouts of the substrate 121.

With the above arrangement, when the front cover 111 is closed, the substrate 121 is positioned at the center of the cassette 110 by the substrate rear end positioning members 110g, 110h, and the substrate front end positioning members 111a, 111b. Thus, even if impact or vibration is imposed during transferring of the cassette 110 with the dolly or the like, there is no possibility that the substrate 121 is displaced from the center of the cassette. Therefore, when the cassette 110 is transferred to, for example, a position near the cassette holder 70 with the dolly 55 as in embodiment 1 of FIG. 1, and the front cover 111 is opened before or after the dolly 55 is positioned at a position near the cassette holder 70, the substrate 121 is maintained in a state where it is positioned at the center of the cassette 110. Of course, there should not occur impact as high as displacing the substrate 121 from the center of the cassette 110 during the dolly 55 is being positioned or the cassette is raised by the rotating arm, but there is no significant displacement to cause a problem in the normal handling or operation.

Figure 21:
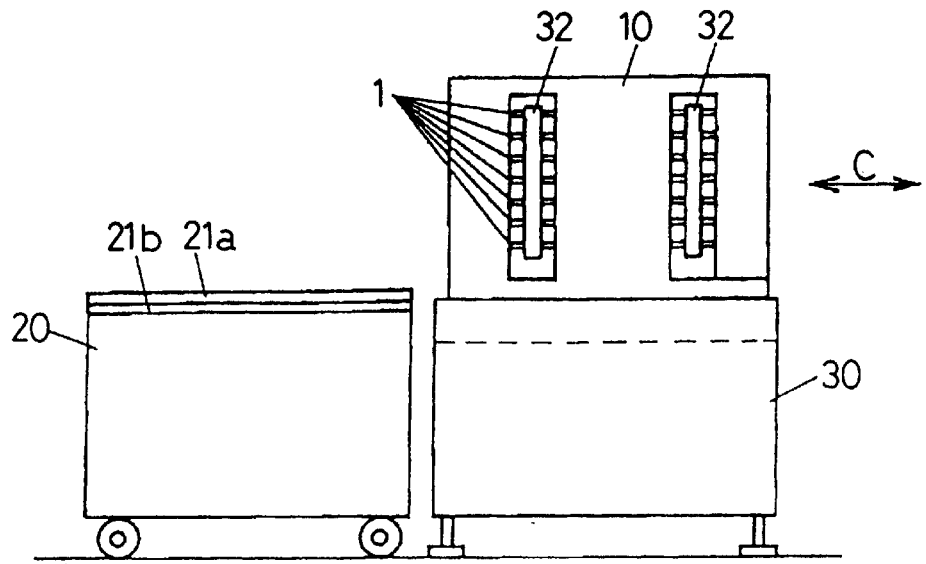
FIG. 21 is a side view for illustrating operation of the method.
Figure 22:
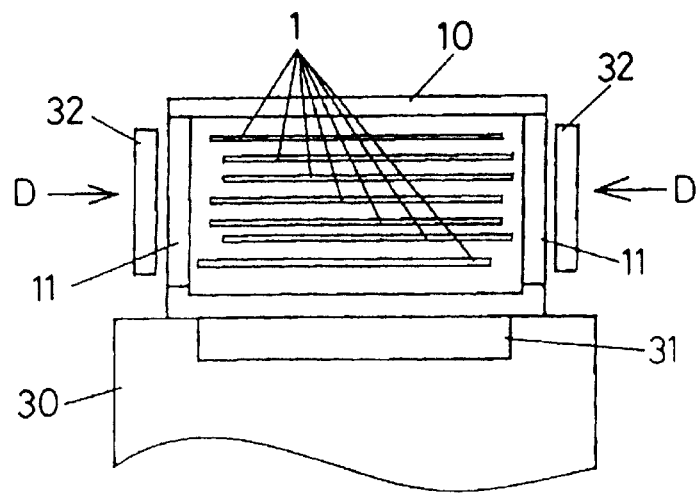
FIG. 22 is a front view for illustrating operation of the method.
Figure 23:
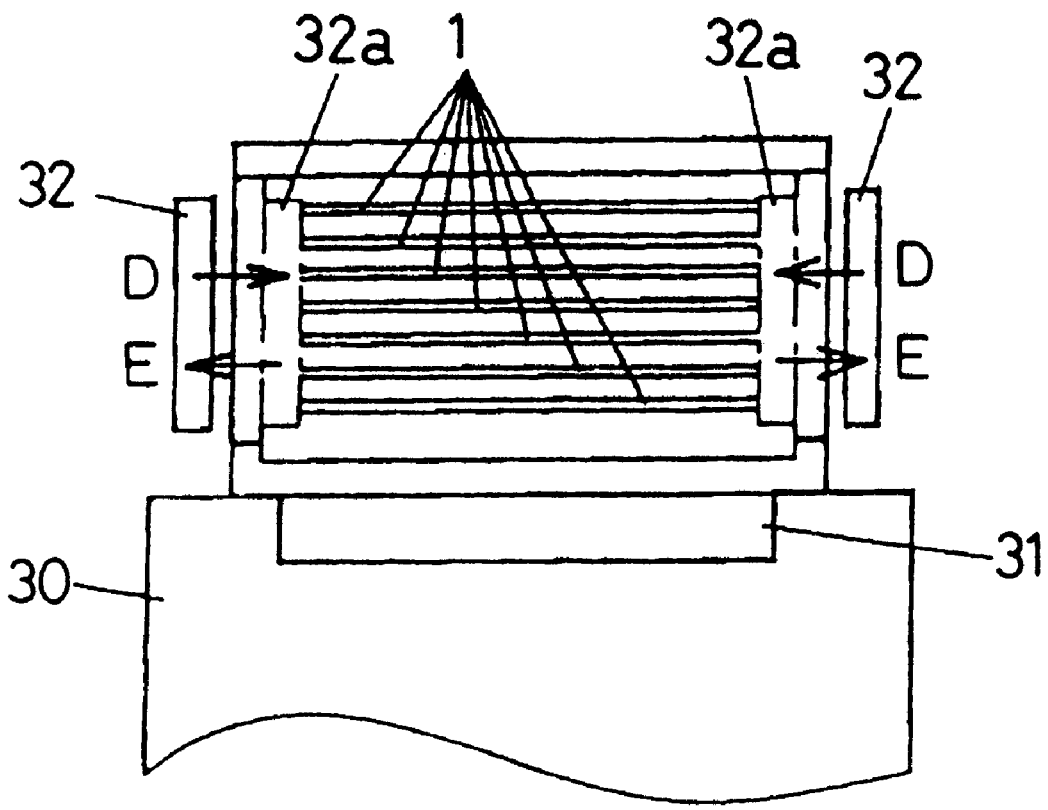
FIG. 23 is a front view for illustrating operation of the method.

With the above arrangement, since the substrate 121 can be aligned to the center of the cassette 110 by opening and closing the front cover 111, there is no need to align the substrates on the cassette holder. Accordingly, the conventional substrate aligning mechanism shown in FIGS. 21, 22, and 23 is not necessary, so that the structure of the cassette holder can be made very simple.

In addition, as the cassette 110 is closed by fixed covers for five surfaces except for the front surface 110e, and by a tightly closeable front cover 111 for the front, the substrates in the cassette would not be contaminated even if it is transferred in an environment with poor cleanness, so that cleanness of the substrate transfer path can be lowered. Therefore, not only the cost can be reduced for constructing a clean room, but also the operation cost can be reduced for maintaining cleanness.

When it is used in an environment where clean environment is maintained, there is no need to close the five surfaces, and to also close the front surface 110e of the cassette 110. It is sufficient to mount the substrate front end positioning members 111a and 111b on the front cover 111.

In addition, if wheels 61 shown in FIG. 4 are mounted on the cassette 110, even if the substrate has a larger size and the cassette containing the substrates has a heavier weight, the cassette can be moved easily and without contamination of the substrate by, for example, rolling on the floor without using the dolly, so that it can highly accommodate an emergency situation.

[Embodiment 5]

Figure 14:
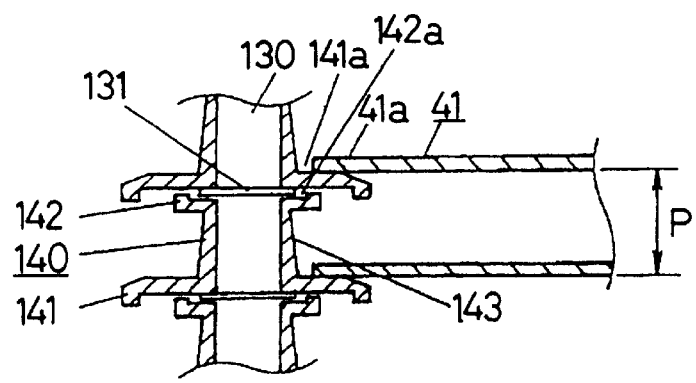
FIG. 14 is a sectional view of essential components of a substrate transfer cassette according to embodiment 5 of the present invention.
Figure 15:
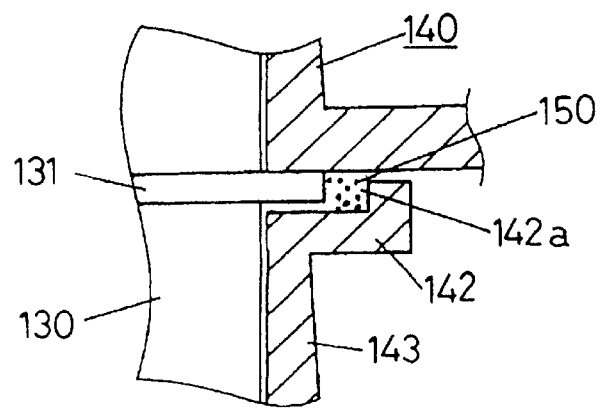
FIG. 15 is an enlarged sectional view of essential components of the embodiment.

Description is given on the substrate transfer cassette according to another embodiment of the present invention with reference to FIGS. 14 and 15.

FIG. 14 is a side view showing a structure of a tray for holding the substrates 41 with a spacing P the description of which is omitted in describing the cassette 10 of FIG. 19. FIG. 15 is an enlarged view of essential components of FIG. 14. In FIGS. 14 and 15, a shaft 130 is mounted on the body (not shown) of a cassette, and rotatably supports a plurality of rotary support members 140 with a pitch P by conventional retaining rings 131. A substrate support collar 141 is formed on the rotary support member 140, and receives an edge 41a of the substrate 41 on its upper surface 141a for supporting a plurality of substrates 41 with the pitch P. A reduced-diameter collar 142 is formed on the rotary support member 140, and has a recess 142a. The recess 142a receives dust 150 generated by rotating contact between the retaining ring 131 and the rotary support member 140. Thus, the reduced-diameter collar 142 serves as a dust receiving collar.

When the substrate 41 is arranged to be supported by the substrate support collar 141 of the rotatable rotary support member 140, even if the substrate 41 strikes against the substrate support collar 141 of the rotary support member 140 or a cylindrical section 143 which has a tapered outer surface when it is manually inserted into or extracted from the cassette, the rotary support member 140 rotates to relax shock of the impact and to suppress generation of dust at the minimum level.

In addition, as the reduced-diameter collar 142 serving as a dust receiving collar is provided on the rotary support member 140, dust generated from a rotating contact area can be trapped before it is diffused, so that the substrate can be prevented from being contaminated.

[Embodiment 6]

Figure 16A:
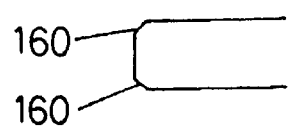
FIG. 16(A) is an enlarged end view of a substrate (linear chamfer) for illustrating embodiment 6 of the present invention.

Description is given on the substrate transfer cassette according to still another embodiment of the present invention with reference to FIGS. 16(A), (B) and 17.

Figure 16B:
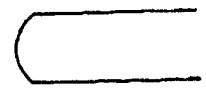
FIG. 16(B) is an enlarged end view of a substrate (rounded chamfer) for illustrating embodiment 6 of the present invention.

Recently, chamfer of the end surface of the substrate is being changed from a linear type shown in FIG. 16(A) to a rounded chamfer with curved corners as shown in FIG. 16(B). It is because, when an end surface strikes against the transfer path during the substrate is being transferred, the linear chamfered edge 160 of FIG. 16(A) tends to be easily chipped off, while the rounded chamfer of FIG. 16(B) does not have a sharp edge, and has a smooth edge, so that it is hardly chipped off. In addition, it is its another feature that, even when a substrate with such rounded chamfer rubs an object softer than the substrate with the rounded chamfer area, the object is hardly ground. A structure of a cassette exploiting this feature is described with reference to FIG. 17.

Figure 17:
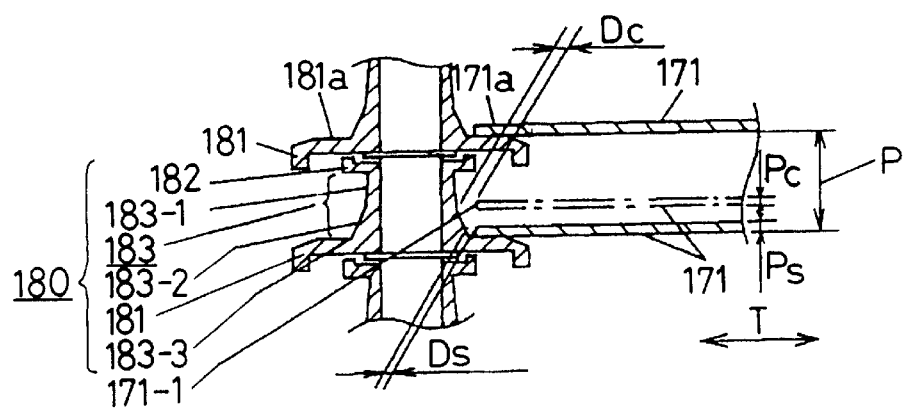
FIG. 17 is an enlarged sectional view of essential components of a substrate transfer cassette according to embodiment 6 of the present invention.

FIG. 17 is similar to FIG. 14, and shows in a sectional view a structure of a tray for supporting substrates 171 with spacing P. As shown in FIG. 17, a rotary support member 180 comprises a substrate support collar 181, a reduce-diameter collar 182, and a cylindrical section 183. The substrate support collar 181 is formed on the rotary support member 180, and receives an edge 171a of the substrate 171 on its upper surface 181a for supporting a plurality of substrates 171 with the pitch P. The cylindrical section 183 consists of an upper cylindrical section 183-1 above the substantially center between the substrate support collars 181, and a lower cylindrical section 183-2 thereunder. The outer diameters of the upper and lower cylindrical sections 183-1 and 183-2 increase from the top to the bottom. In addition, an angle between the side surface and the bottom of the upper cylindrical section 183-1 is formed to be larger than that of the lower cylindrical section 183-2. That is, the lower cylindrical section 183-2 is more spread toward the bottom than the upper cylindrical section 183-1. With such arrangement, when a robot (not shown) inserts a substrate 171 into the cassette, it performs the operation at a position Pc at the substantially center between the substrate support collars 181, there is provided sufficient spacing Dc between the cylindrical section 183 and the end surface 171-1 of the substrate 171. so that there is no possibility of collision between the substrate 171 and the rotary support member 180. When the robot is lowered after completing the insertion of the substrate 171 at the position Pc, the substrate 171 is placed at a position Ps on the substrate support collar 181. In this state, since there is a narrow spacing Ds between the lower larger-diameter section 183-3, which is the bottom outer surface of the lower cylindrical section 183-2, and the end surface 171-1 of the substrate 171, the substrate 171 is never displaced significantly during its transferring. That is, the substrate 171 is positioned at the center in direction T. If the substrate 171 is displaced from the center in direction T at the position Pc, when the substrate 171 is lowered to the position Ps, its end surface 171-1 of the substrate 171 contacts the lower cylindrical section 183-2. However, since the end surface 171-1 is round chamfered as described above, and the lower cylindrical section 183-2 is hardly ground even if it is made of resin, dust is hardly generated. The above arrangement enables the substrate to be successfully positioned in direction T. The outer diameter of the upper cylindrical section 183-1 may have an equal diameter from the top to the bottom.

Next, an embodiment of a cassette is described with reference to FIG. 18 for a case where it is also positioned in a direction orthogonal to direction T.

Figure 18:
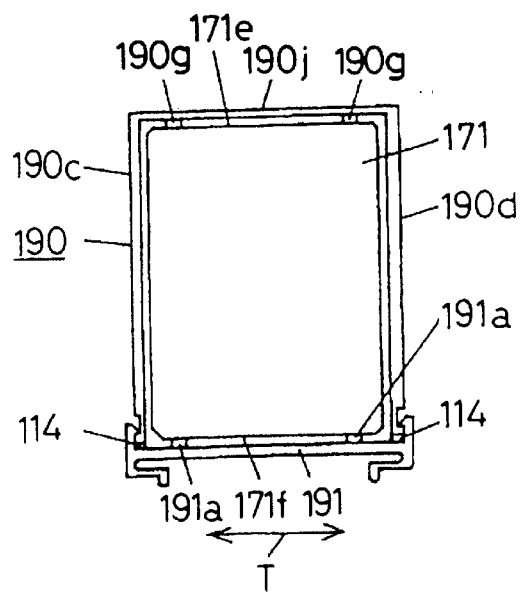
FIG. 18 is a plan view of the embodiment.

FIG. 18 is a plan view of a cassette 190. In the figure, the cassette 190 is covered for its top surface, bottom surface, side surfaces 190c and 190d, and the rear surface 190j with covers, and contains substrates 171 therein. A front cover 191 is rotatably supported as in the front cover 111 shown in FIG. 11. A packing 114 is similar to that shown in FIG. 11.

A substrate rear end positioning member 190g is provided on the cassette 190, and closes in a rear end surface 171e of the substrate 171 with a predetermined gap. A substrate front end positioning member 191a is provided on the front cover 191, and closes in a front end 171f of the substrate 171 with a predetermined gap. These predetermined gaps may be sufficient to be of an amount for maintaining the substrate 171 at its state positioned at the center of the cassette 190 so that a robot (not shown) can place a substrate 171 extracted from the cassette 190 at a predetermined position of the substrate processing machine (not shown). In addition, the substrate front end positioning member 191a and the substrate rear end positioning member 190g may abut against the front end 171f and the rear end 171e of the substrate 171, respectively. When at least one of the substrate rear end positioning member 190g or the substrate front end positioning member 191a is made of a resilient material, the substrate front end positioning member 191a and the substrate rear end positioning member 190g may close contact the front end 171f and the rear end 171e of the substrate 171, respectively.

With the above arrangement, the substrate 171 is positioned at the center in direction T by the lower larger-diameter section 183-3 of the lower cylindrical section 183-2, and at the center in the longitudinal direction (direction orthogonal to direction T) of the cassette 190 by the substrate front end positioning member 191a and the substrate rear end positioning member 190g.

Therefore, since the substrate 171 can be aligned at the center of the cassette 190 as in embodiment 4, there is no need to provide the conventional substrate aligning mechanism, so that the structure of the cassette holder can be significantly simplified.

An advantage of this embodiment lies in that it does not require accuracy of corner cutouts when compared with embodiment 4.

As described above, according to the substrate transfer method of the present invention, the total length of the dolly and the cassette holder can be dramatically reduced than the conventional arrangement. Since the cassette holder is disposed at the substrate entrance of the substrate processing machine, it is possible to significantly reduce the entire area including the substrate processing machine, the dolly, and the cassette holder than the conventional arrangement. Therefore, the required area for a clean room can be reduced, so that there is attained a significant advantage that not only its construction cost can be reduced, but also the operation cost can be reduced for maintaining cleanness. In addition, since the cassette can be moved to a location opposite to the dolly, and placed on the holder, a robot for extracting the substrate from the cassette can be inexpensively constructed. Furthermore, the transfer operability is improved, so that substrate with different size can be effectively fed into the process.

In addition, according to the substrate transfer cassette of the present invention, since not only the structure of the cassette holder can be very simplified, but also the substrate transfer path may have lower cleanness, not only the cost can be reduced for constructing a clean room, but also the operation cost can be reduced for maintaining cleanness. Furthermore, even if the cassette containing the substrate has heavier weight due to a larger substrate size, it can be moved easily and without contamination of the substrate by, for example, rolling on the floor without using the dolly, so that it can highly accommodate an emergency situation. Still further, when a substrate is manually inserted in or extracted from the cassette, even if the substrate collides against the support member supporting the substrate, the support member rotates, so that not only impact of collision is relieved and generation of dust can be minimized, but also dust generated from a rotating contact area can be received before it spreads into a space in the cassette to prevent the substrate from being contaminated.

What is claimed is:

1. A substrate transfer method comprising the steps of:

moving a dolly to a location near a cassette holder having a rotating arm located within said cassette holder, the dolly loading a substrate transfer cassette containing substrates; and transferring the substrates in a state in which the substrate transfer cassette is raised and held with said rotating arm by actuating said rotating arm.

2. The substrate transfer method as set forth in claim 1, wherein means for rotating the rotating arm is mounted within the cassette holder.

3. The substrate transfer method as set forth in claim 1, wherein the dolly has an escape for avoiding interference with the rotating arm.

4. The substrate transfer method as set forth in claim 1, wherein, after raising and holding the substrate transfer cassette with said rotating arm, moving the substrate transfer cassette on the cassette holder in a direction opposite to the dolly by a predetermined distance, wherein the substrates are transferred.

5. The substrate transfer method as set forth in claim 1, wherein, after moving the dolly to the location near the cassette holder, positioning the dolly by pushing it between at least a pair of rollers mounted on the cassette holder in such a manner that the rollers hold both outer sides of the dolly therebetween.

6. The substrate transfer method as set forth in claim 1, wherein the substrate transfer cassette and the dolly, and the substrate transfer cassette and the rotating arm of the cassette holder, respectively, have fitting sections between each other, and a plurality of the substrate transfer cassettes with different outer dimensions have fitting sections of a common size.

* * * * *